US006529327B1

(12) United States Patent
Graindorge

(10) Patent No.: US 6,529,327 B1
(45) Date of Patent: Mar. 4, 2003

(54) PARTLY REFLECTING OPTICAL COMPONENT AND LASER SOURCE INCORPORATING SUCH A COMPONENT

(75) Inventor: Philippe Graindorge, Chevigny Saint Sauveur (FR)

(73) Assignee: Photonetics, Marly le Roi (FR)

( * ) Notice: Subject to any disclaimer, the term of this patent is extended or adjusted under 35 U.S.C. 154(b) by 0 days.

(21) Appl. No.: 09/605,533

(22) Filed: Jun. 29, 2000

(30) Foreign Application Priority Data

Jun. 30, 1999 (FR) .............................. 99 08400

(51) Int. Cl.[7] .................. G02B 5/18; G02B 27/10; G02B 5/04; H01S 3/08; H01S 3/10
(52) U.S. Cl. .................. 359/566; 359/629; 359/638; 359/834; 372/20; 372/99; 372/100; 372/102
(58) Field of Search .................. 359/496, 567, 359/566, 569, 572, 618, 629, 633, 634, 636, 638, 833, 834; 372/20, 96, 99, 100, 102

(56) References Cited

U.S. PATENT DOCUMENTS

| 3,517,327 A | * | 6/1970 | Treuthart ............... 359/834 |
| 4,641,920 A | * | 2/1987 | Matsuoka et al. |
| 5,013,136 A | * | 5/1991 | Whitehead et al. ......... 359/834 |
| 5,172,186 A | * | 12/1992 | Hosoe |
| 5,325,175 A | * | 6/1994 | Mocker et al. ............. 359/638 |
| 5,387,953 A | * | 2/1995 | Minoura et al. ............ 359/495 |
| 5,594,744 A | * | 1/1997 | Lefevre et al. |
| 5,802,085 A | * | 9/1998 | Lefevere et al. |
| 5,886,785 A | * | 3/1999 | Lefevre et al. |
| 6,252,718 B1 | * | 6/2001 | Lefevre ...................... 359/618 |

FOREIGN PATENT DOCUMENTS

| EP | 702438 | | 3/1996 |
| EP | 917261 | | 5/1999 |
| EP | 1065766 | * | 1/2001 |
| EP | 1065767 | * | 1/2001 |
| JP | 57099793 | | 6/1982 |

* cited by examiner

*Primary Examiner*—Ricky D. Shafer
(74) *Attorney, Agent, or Firm*—Arent Fox Kintner Plotkin and Kahn

(57) ABSTRACT

A partially reflecting optical component (11) generating, from an incident beam (12), two secondary beams, one of them being reflected (13), the other one being transmitted (14). According to the invention, it comprises a first wholly reflecting planar face (15) and a second partially reflecting planar face (16), the second face being perpendicular to the first one, a third wholly reflecting planar face (17), the first and third faces being in the same plane, this component providing the unidimensional auto-alignment of the reflected beam (13) with the incident beam (12), the respectively transmitted and reflected beams being each formed with two half-beams having matching wave fronts. The invention also relates to an external cavity laser source comprising such a component as a unidimensional auto-aligned reflector.

11 Claims, 5 Drawing Sheets

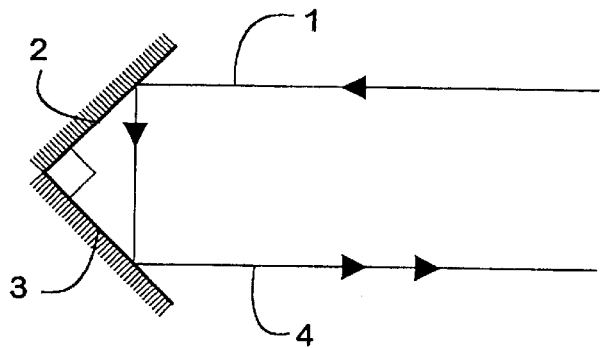
STATE OF THE ART
FIGURE 1
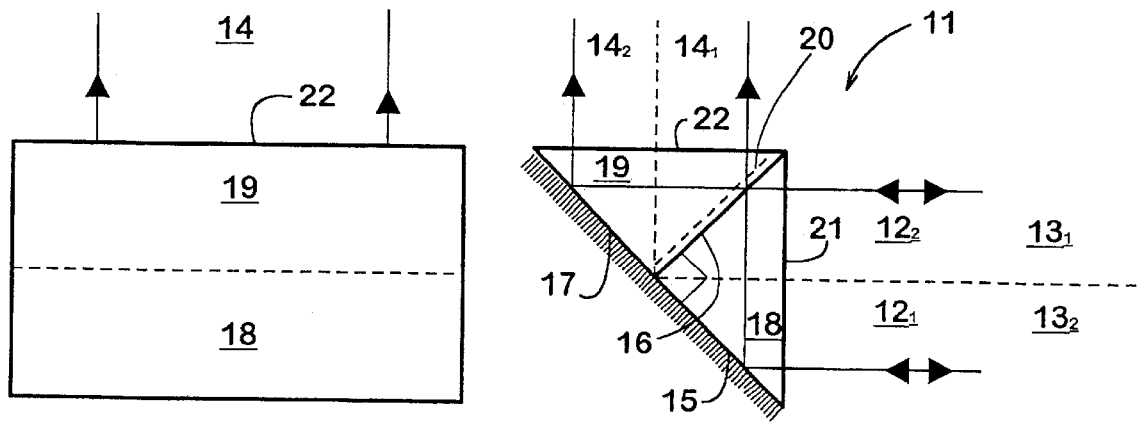
FIGURE 2
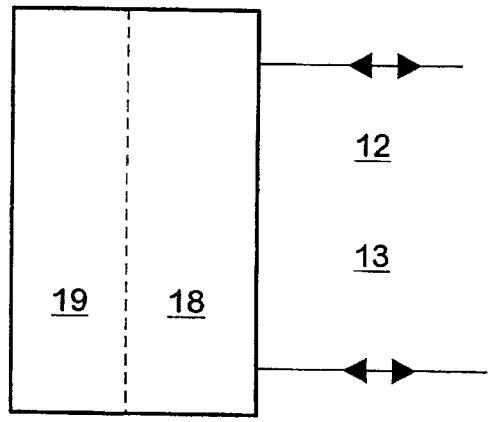

PARTLY REFLECTING OPTICAL COMPONENT AND LASER SOURCE INCORPORATING SUCH A COMPONENT

CROSS-REFERENCE TO RELATED APPLICATIONS

The present application claims priority under 35 U.S.C. §119 of French Patent Application No. 99 08400 filed Jun. 30, 1999, the disclosure of which is expressly incorporated by reference herein in its entirety.

BACKGROUND OF THE INVENTION

1. Field of the Invention

The present invention relates to a partially reflecting optical component generating, from an incident beam, two secondary beams, one of them being transmitted, the other one being reflected, and providing the unidimensional auto-alignment of the reflected beam with the incident beam, the respectively transmitted and reflected beams being each formed with two half-beams having matching wave fronts.

2. Discussion of Background Information

A component of this type shows indeed significant advantages in many applications such as laser sources with an auto-aligned external cavity. But a device of this type has not been designed yet nor has it been manufactured.

By auto-alignment, is meant the property of an optical system for which the properties of the outgoing light flow having little sensitivity to the orientation or to the position of the system compared to the incoming flow. The auto-alignment may be performed in two dimensions, i.e., in all the planes parallel to the direction of the incoming beam, or in a single dimension, i.e., in only one of these planes.

A laser cavity using a unidimensional total auto-aligned reflector, such as illustrated in FIG. 1, is described in the European patent application EP-95 402 073, published as EPO 702 438 B1 on Jun. 23, 1999. This reflector has two reflecting planar faces 2 and 3, supported by mirrors or by the faces of a prism. An incident beam 1 is reflected by face 2 and subsequently by face 3 and as long as these faces are perpendicular, the emerging beam 4 is reflected in the parallel direction and in the reverse way compared to the incident beam 1.

Partially transmitting mirrors are also known which are, among other things, used to provide the extraction of the light flow from most laser cavities.

SUMMARY OF THE INVENTION

The present invention makes it therefore possible to combine, in one element, the function of unidimensional auto-aligned retroreflection with the function of partial transmission. Up to now, these functions were both obtained with different components located at different positions in the laser cavity.

The invention consequently aims to offer a single component which provides both a function of unidimensional auto-aligned reflector and a function of sharing the incident flow as well.

In this respect, the invention relates to a partially reflecting optical component generating, from an incident beam, two secondary beams, one of them being transmitted, the other one being reflected.

According to the invention, the partially reflecting optical component includes:

a first completely reflecting planar face, a second partially reflecting planar face, the second face being perpendicular to the first one, a third completely reflecting planar face, the first and third faces being in the same plane, this component providing the unidimensional auto-alignment of the reflected beam with the incident beam, the respectively transmitted and reflected beams being each formed with two half-beams having matching wave fronts.

Advantageously, the invention may be obtained according to the following embodiments adapted to be associated according to all the technically possible combinations and each showing their own advantages:

- the first and the second faces are the faces of a single first prism and the third face is supported by a second prism bearing a fourth face being in contact with the second face of the first prism, both prisms having preferably the same refractive index;
- the beam being transmitted is sent back in parallel to the incident beam by a completely reflecting fifth face, supported by the second prism;
- the fifth face is parallel to the second face, the beam transmitted being sent back in the opposite direction to the incident beam;
- the fifth face is parallel to the third face, the transmitted beam being sent back in the same direction as the incident beam,
- the first and second prisms are secured to one another and form a unitary block the mutual face orientations of which are controlled, whichever prism they may belong to;
- one of the second and fourth faces has a partially reflecting treatment.

The invention also relates to an external cavity laser source having a partially reflecting system which is auto-aligned unidimensionally, as described above, forming the auto-aligned reflecting system and allowing the extraction of a flow outgoing from the source in the same position in the source.

This external cavity laser source may advantageously have a diffraction network in the cavity, arranged with respect to the auto-aligned reflector in the Littman-Metcalf configuration. It can be adjustable in wave length and the outgoing flow is advantageously redirected towards the network in a direction parallel to the axis of the cavity. It can also be multi-wave length with the use of a semi-conducting multi-guide chip.

According to the invention, a partially reflecting optical component generates, from an incident beam, two secondary beams, one of the secondary beams being reflected, the other secondary beam being transmitted The optical component comprises a first completely reflecting planar face, a second partially reflecting planar face, perpendicular to the first face, and a third completely reflecting planar face. The first and third faces are disposed in the same plane. The component provides unidimensional auto-alignment of the one of the secondary beams with the incident beam. The one and the other of the secondary beams are each formed with two half-beams having matching wave fonts.

According to a further aspect of the invention, the first and the second faces are faces of a same first prism and the third face is supported by a second prism bearing a fourth face in contact with the second face of the first prism. The other secondary beam is sent back parallel to the incident beam by a fifth completely reflecting face, supported by the second prism. The fifth face is parallel to the second face, the other secondary beam being sent back in the opposite direction to the incident beam. Further, the fifth face may be parallel to the third face, the other secondary beam being sent back in the same direction as the incident beam. The first and second prisms may be secured to one another to form a unitary block, the mutual face orientations of which are controlled, regardless of the prism to which they belong. One of the second and fourth faces may bear a partially reflecting treatment.

Moreover, the invention contemplates an external cavity laser source including an optical component forming a unidimensional auto-aligned reflecting system and allowing extraction of an outgoing flow from the source, the optical component generating, from an incident beam two secondary beams one of the secondary beams being reflected the other secondary beam being transmitted. The optical component comprises a first completely reflecting planar face, a second partially reflecting planar face, perpendicular to the first face, and a third completely reflecting planar face. The first and third faces are disposed in the same plane. The component provides unidimensional auto-alignment of the one of the secondary beams with the incident beam, the one and the other of the secondary beams being each formed with two half-beams having matching wave fronts.

The laser source further comprises within the cavity a diffraction network arranged in the Littman-Metcalf configuration, with respect to the auto-aligned reflector. The laser source is matchable in wave length. The cavity is folded with an additional reflecting dihedral and in that the auto-aligned reflector closes the cavity after a second diffraction on the network. The source may be mufti-wave length component directs the other secondary beam to a network in a direction parallel to an axis of the cavity between the network and the reflector to generate a beam parallel to an intra-cavity beam.

The first and the second faces may be faces of a same first prism and the third face is supported by a second prism bearing a fourth face in contact with the second face of the first prism. The other secondary beam may be sent back parallel to the incident beam by a fifth completely reflecting face supported by the second prism. The fifth face may be parallel to the second face, the other secondary beam being sent back in the opposite direction to the incident beam. Further, the fifth face may be parallel to the third face the other secondary beam being sent back in the same direction as the incident beam. The first and second prisms are secured to one another and form a unitary block, the mutual face orientations of which are controlled, regardless of the prism to which they belong. One of the second and fourth faces may bear a partially reflecting treatment.

BRIEF DESCRIPTION OF THE DRAWINGS

The invention will be now described more detail referring to the accompanying drawings in which:

FIG. 1 is a side view of a unidimensional total auto-aligned reflector of the prior art;

FIG. 2 is a view in three orthogonal directions of an optical component according to the invention;

DETAILED DESCRIPTION OF THE PRESENT INVENTION

Figure 3:
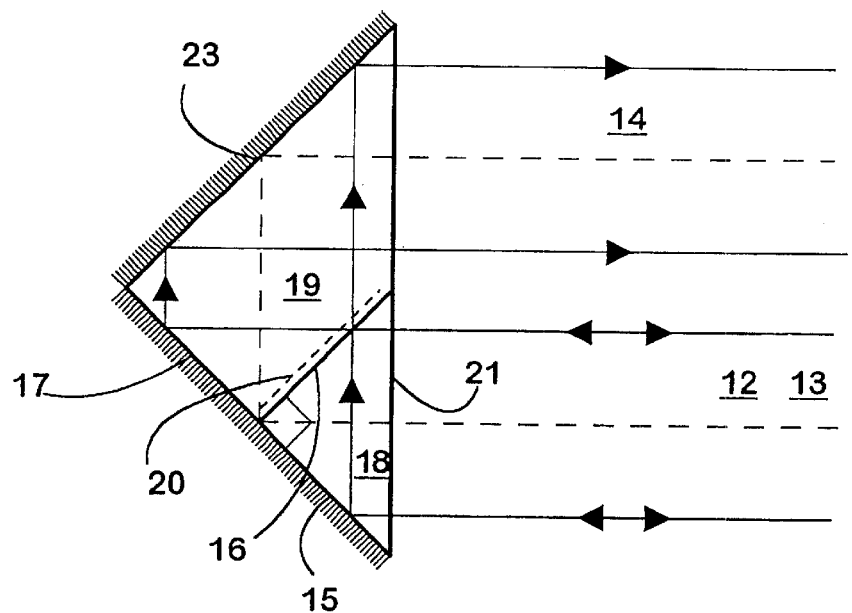
FIG. 3 shows an optical component according to the invention, sending back the extracted light flow in the parallel direction and opposite to that of the incident beam.

FIG. 2 is therefore is a view of an optical component 11 made with two straight isosceles rectangular prisms.

The incident beam 12 is divided by this optical component 11 into two secondary beams, one beam 13 being reflected in parallel and in an opposite direction with respect to the incident beam 12 and the other beam 14 being transmitted and sent back, in this case in the perpendicular direction with respect to the incident beam 12.

The optical component 11 has a completely reflecting first planar face 15 and a partially reflecting planar face 16 being perpendicular to the first planar face 15.

It also has a completely reflecting third planar face 17 located in the same plane as the first planar face 15.

Thus, the retro-reflected beam 13 is formed from the incident beam 12 with two successive reflections, respectively on both perpendicular faces 15 and 16 of the component 11. It is known, and this has been described referring to FIG. 1 that, in such conditions, the angle formed by the retro-reflected beam 13 with the incident beam 12 equals 180°, being double the 90° angle formed by the two faces 15 and 16. The retro-reflected beam 13 is therefore sent back in parallel and in the opposite direction with respect to the beam 12.

The beam 14 is transmitted through the second face 16 and formed by reflection on the first face 15 and the third face 17 which are coplanar. When the incident beam 12 is inclined 45° with respect to the normal to the plane formed by the planar faces, the first face 15 and the third face 17, and the transmitted beam 14, respectively, are perpendicular to the incident beam 12.

The optical component 11 thereby fulfills both functions that are assigned to it, namely, the production from an incident beam 12, on the one hand, of a unidimensional reflected auto-aligned beam 13 and, on the other hand, of a transmitted beam 14.

The energy ratio of the beam 13 to the beam 14 depends on the reflection rate of the partially reflecting face 16.

Advantageously, the first and the second faces 15 and 16 are the faces of a prism 18 and the third face 17 is supported by a prism 19 which has a fourth face 20 in contact with the second face 16 of the first prism 18. Prisms 18 and 19 have isosceles rectangular sections. Their last faces are respectively designated by numerals 21 and 22.

Both emerging beams 13 and 14 generated by this component are made of two half-beams, each being in phase with the other, namely, in such a way that for the retro-reflected beam 13, the wave fronts of both half-beams $13_1$ and $13_2$ are matching. The same applies for both half-beams $14_1$ and $14_2$ which form the extracted beam 14. In other words, the incoming beam 12 is intersected by this component, both half-beams $12_1$ and $12_2$ respectively forming the retro-reflected half-beams $13_1$ and $13_2$ and the transmitted half-beams $14_1$ and $14_2$. The half-beams $13^1$ and $13_2$, on the one hand, and the half-beams $14_1$ and $14_2$, on the other hand, are in phase, their wave fronts matching, which makes it possible for each of them to be effectively coupled again in a monomode fiber or wave guide.

In some applications, it is useful that the direction of the transmitted beam 14 is parallel to that of the incident beam 12.

The optical component shown in FIG. 3 allows a result wherein the direction of the extracted beam 14 is opposite that of the incident beam 12. This figure shows therefore the elements 15–21 of the prism illustrated in FIG. 2 and a fifth integral face 23 being part of the same prism as the third face 17 and fourth face 20, on which face the emerging beam 14 is reflected once again. This face 23 is parallel to the second face 16 of the optical component, the direction of the emerging beam being parallel and in the opposite direction with respect to the incident beam 12.

Figure 4:
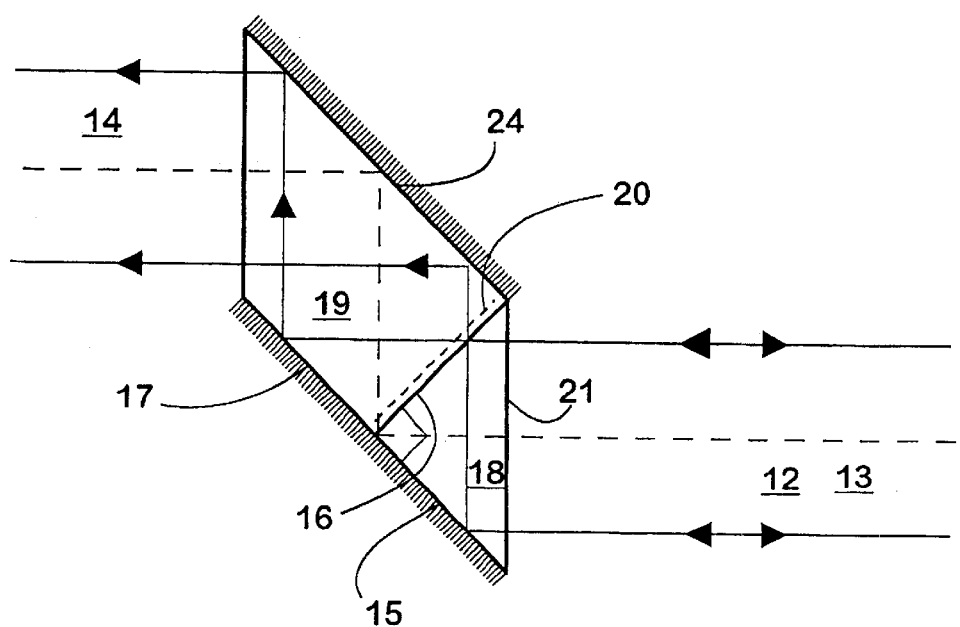
FIG. 4 shows an optical component according to the invention with the emerging flow being sent back in a parallel direction and in the same direction as the incident beam.

Similarly and as shown in FIG. 4, this result, namely the parallelism of the emerging beam 14 with the incident beam 12, may be obtained with the use of a second prism comprising a fifth face 24 parallel to the third face 17.

This face 24, being completely reflecting, is parallel to the third face 17, the emerging beam 14, is reflected on this face 24, is parallel and in the same direction as the incident beam 12.

Figure 5:
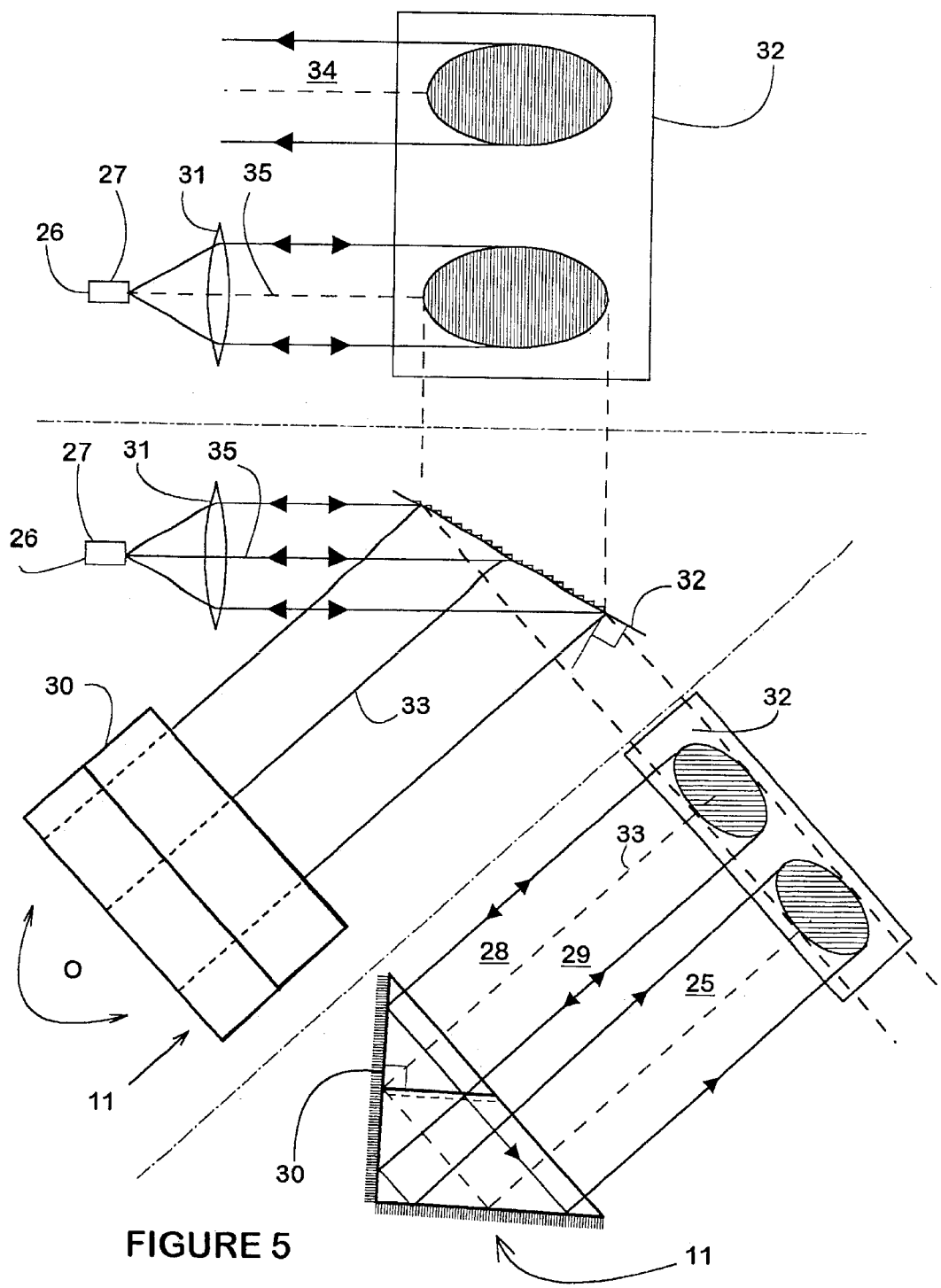
FIG. 5 shows an external cavity laser source incorporating the optical component according to the invention, as mentioned above, in a first configuration.

FIG. 5 shows schematically the use of an optical component illustrated in FIG. 3, globally designated by numeral 11, for the extraction of the outgoing light flow 25 from a laser cavity. This cavity is formed between the external face 26 of a laser diode 27 and the partially transparent reflector formed by the optical component of the invention 11 and generating a partially reflected flow 29 from the incoming flow 28. It is understood thereby, that the optical component 11 represents the equivalent of a partially transparent window adapted to form the outlet face of a laser cavity and simultaneously, the equivalent of a partially reflecting mirror which sends back part of the incident light beam on itself, with a unidimensional auto-alignment, enabling a good stability of the cavity.

Advantageously, a lens 31 is arranged within the cavity with a diffraction network 32 which is arranged in such a way with respect to the partial retro-reflector 30 that this assembly network 32—retro-reflector 30 functions in the Littman-Metcalf configuration.

A particularly stable laser source is thereby obtained which can be matched as described further by rotating the retro-reflector 30, alone or in combination with the network 32 or also by the shifting the lens 31. It is moreover known that it is possible to check the respective movements of the network 32 and the retro-reflector 30, in such a way as to provide a continuous variation of the emission wave length generated by such a laser.

Moreover, the emerging beam 25 is sent back in a direction parallel to the arm axis 33 of the laser cavity comprised between the network 32 and the retro-reflector 30. This arrangement enables generation of an outgoing beam 34 which has been submitted to an additional spectral filtering on the network, enabling an effective filtering of the residual amplified spontaneous emission (or ASE for Amplified Spontaneous Emission) of the laser source.

This configuration additionally allows a reverse anamorphosis to compensate the ellipticity of the beam 25 as a result of its generation by the network 32 which is inclined with respect to the axis 35 of the light beam in the cavity between the diode 27 and the network 32. The outgoing beam 34 of the laser has thus a size identical to that of the beam 35 of the cavity between the lens 31 and the network 32, and remains parallel to it, regardless of the variation of the orientation of the network 31 or of the component 11. In effect, the outgoing wave length and that within the cavity are identical and the angle between the emitted beams 25 and 34 is identical to that between the axes 33 and 35 of the intra-cavity beams.

This arrangement can therefore be implemented and used for a source being matchable in wave length wherein the component 11 is rotationally mobile as it enables keeping the direction of the outgoing beam constant after the second pass on the network.

Figure 6:
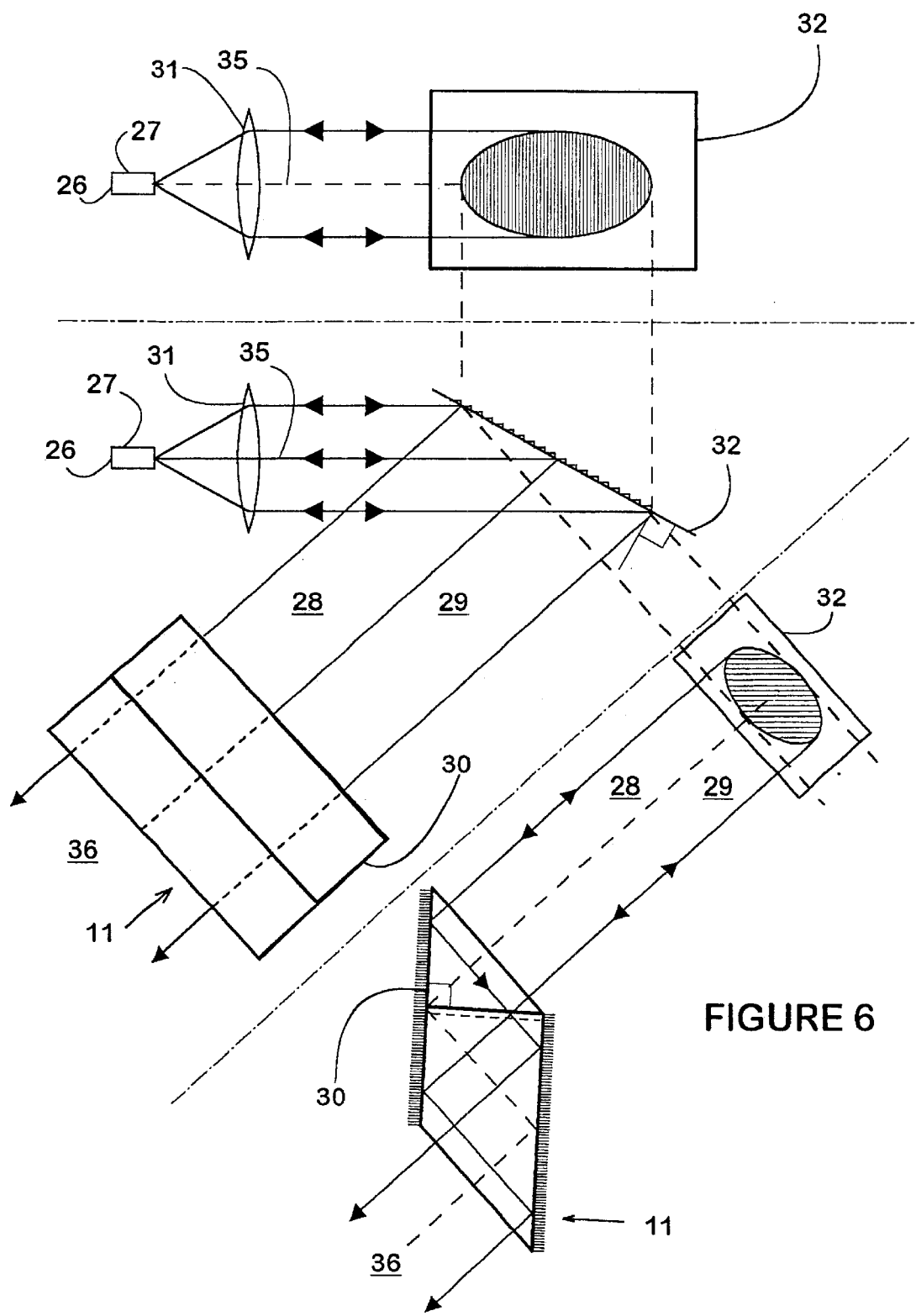
FIG. 6 shows an external cavity laser source incorporating the optical component according to the invention, as mentioned above, in a second configuration.

The resulting source stability also allows the advantageous exploitation of the assembly shown in FIG. 6, wherein the elements also shown in FIG. 5 retain the same numerals. The emitted beam 36 always goes out parallel to the intra-cavity beams 28 and 29, but does not go again any longer on the network 32.

This configuration is particularly useful for obtaining a multi-wave length source where a multi-diode chip is positioned instead of the single diode 27. Emerging flows are thereby obtained, which are superposed in direction and in position, whatever their wave length may be.

Figure 7:
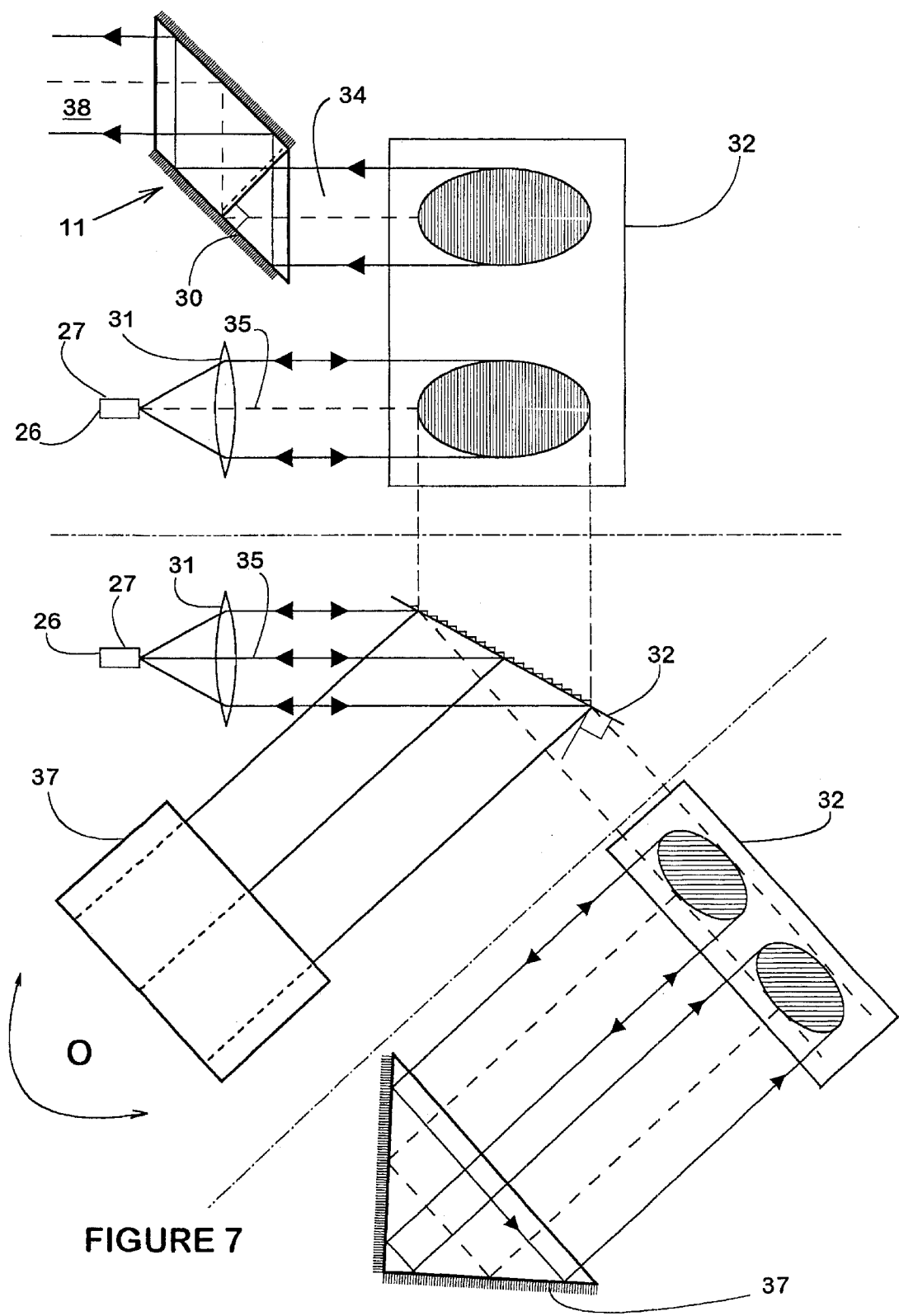
FIG. 7 shows an external cavity laser source incorporating the optical component according to the invention, as mentioned above, in a third configuration.

FIG. 7 shows an additional embodiment of the configuration in FIG. 6 where an additional reflecting dihedral 37 refolds the cavity and where the component 11 of the invention closes the cavity after a second diffraction on the network 32.

The outgoing beam 38 is parallel to the axis of the intra-cavity beam 35 and has the same dimension, having undergone a reverse anamorphosis after the second diffraction on the network. This configuration can also use a multi-diode chip instead of the single diode 27.

What is claimed is:

1. An external cavity laser source including an optical component forming a unidimensional auto-aligned reflecting system and allowing extraction of an outgoing flow from the source, the optical component generating, from an incident beam, two secondary beams, one of the secondary beams being reflected, the other secondary beam being transmitted, said optical component comprising:

a first completely reflecting planar face;

a second partially reflecting planar face, perpendicular to the first face;

a third completely reflecting planar face;

the first and third faces being disposed in the same plane, said component providing unidimensional auto-alignment of said one of the secondary beams with the incident beam, the one and the other of said secondary beams being each formed with two half-beams having matching wave fronts, and within the cavity, a diffraction network arranged in a Littman-Metcalf configuration, with respect to the optical component.

2. The external cavity laser source according to claim 1, wherein the cavity is folded with an additional reflecting dihedral and in that the auto-aligned reflecting system closes the cavity after a second diffraction on the network.

3. The external cavity laser source according to claim 1, wherein the source is multi-wave-length.

4. The external cavity laser source according to claim 1, wherein the first and the second faces are faces of a same first prism and the third face is supported by a second prism bearing a fourth face in contact with the second face of the first prism.

5. The external cavity laser source according to claim 4, wherein the other secondary beam is sent back parallel to the incident beam by a fifth completely reflecting face, supported by the second prism.

6. The external cavity laser source according to claim 5, wherein the fifth face is parallel to the second face, the other secondary beam being sent back in the opposite direction to the incident beam.

7. The external cavity laser source according to claim 5, wherein the fifth face is parallel to the third face, the other secondary beam being sent back in the same direction as the incident beam.

8. The external cavity laser source according to claim 4, wherein the first and second prisms are secured to one another and form a unitary block, mutual face orientations of said first and second prisms being controlled, regardless of the prism to which they belong.

9. The external cavity laser source according to claim 8, wherein one of the second and fourth faces bears a partially reflecting treatment.

10. An external cavity laser source including an optical component forming a unidimensional auto-aligned reflecting system and allowing extraction of an outgoing flow from the source, the optical component generating, from an incident beam, two secondary beams, one of the secondary beams being reflected, the other secondary beam being transmitted, said optical component comprising:

a first completely reflecting planar face;

a second partially reflecting planar face, perpendicular to the first face;

a third completely reflecting planar face;

the first and third faces being disposed in the same plane, said component providing unidimensional auto-alignment of said one of the secondary beams with the incident beam, the one and the other of said secondary beams being each formed with two half-beams having matching wave fronts, and within the cavity, a diffraction network arranged in a Littman-Metcalf configuration, with respect to the optical component;

the optical component being rotatably mounted whereby the source is tunable.

11. The external cavity laser source according to claim 10, wherein the component directs the other secondary beam to the network in a direction parallel to an axis of the cavity between the network and the reflecting system generate a beam parallel to an intra-cavity beam.

* * * * *